(12) United States Patent
Ruitenburg

(10) Patent No.: US 7,519,342 B2
(45) Date of Patent: Apr. 14, 2009

(54) TUNABLE TRACKING FILTER

(75) Inventor: Leonardus Joseph Michael Ruitenburg, Swalmen (NL)

(73) Assignee: NXP B.V., Eindhoven (NL)

( * ) Notice: Subject to any disclaimer, the term of this patent is extended or adjusted under 35 U.S.C. 154(b) by 728 days.

(21) Appl. No.: 10/538,372

(22) PCT Filed: Nov. 27, 2003

(86) PCT No.: PCT/IB03/05503

§ 371 (c)(1),
(2), (4) Date: Jun. 13, 2005

(87) PCT Pub. No.: WO2004/055984

PCT Pub. Date: Jul. 1, 2004

(65) Prior Publication Data

US 2006/0072276 A1     Apr. 6, 2006

Related U.S. Application Data

(60) Provisional application No. 60/433,366, filed on Dec. 13, 2002.

(51) Int. Cl.
*H04B 1/00* (2006.01)
*H04B 17/00* (2006.01)

(52) U.S. Cl. .................. 455/213; 455/226.1; 455/307; 375/227; 334/78

(58) Field of Classification Search ............... 455/213, 455/226.1, 183.2, 150.1, 160.1, 230, 339, 455/179.1, 184.1, 192.3, 296, 63.1; 375/227; 333/174, 175
See application file for complete search history.

(56) References Cited

U.S. PATENT DOCUMENTS

| | | | |
|---|---|---|---|
| 5,060,297 A | 10/1991 | Ma et al. | |
| 5,949,290 A * | 9/1999 | Bertram | 331/9 |
| 6,072,999 A * | 6/2000 | Konishi et al. | 455/286 |
| 6,983,136 B2 * | 1/2006 | Mason et al. | 455/307 |

FOREIGN PATENT DOCUMENTS

EP   0 766 391 A   4/1997

* cited by examiner

*Primary Examiner*—Tony T. Nguyen
(74) *Attorney, Agent, or Firm*—Peter Zawilski

(57) ABSTRACT

An integrated tuner circuit has an arbitrary IF (intermediate frequency) output. The tuner includes an integrated circuit with a fixed-frequency control loop and a matched external variable capacitance $C_t$, to achieve tracking of a tuned LC band-pass filter with an arbitrary oscillator.

15 Claims, 2 Drawing Sheets

TUNABLE TRACKING FILTER

CROSS REFERENCE TO RELATED APPLICATION

This application claims the benefit of U.S. provisional application Ser. No. 60/433,366 filed Dec. 13, 2002, which is incorporated herein by reference.

The present invention relates in general to an integrated tuner circuit, e.g., for use in televisions and radios, and more particularly, to the tracking of a tuner filter with an arbitrary oscillator.

Tuner technology has evolved to the point where a tuner for a television signal receiver, radio, etc., can now be formed on a single integrated circuit. Currently available integrated tuners are generally application specific, i.e., the tuners are designed for operation using specific oscillator and intermediate (IF) frequencies. Thus, different integrated tuners may be required for different RF applications.

The present invention provides an integrated tuner circuit with an arbitrary IF output The tuner includes an integrated circuit (IC) control loop, and matched external variable capacitance $C_t$, to achieve tracking with an arbitrary oscillator.

These and other features of this invention will be more readily understood from the following detailed description of the various aspects of the invention taken in conjunction with the accompanying drawings in which.

It should be noted that the drawings are merely schematic representations, not intended to portray specific parameters of the invention. The drawings are intended to depict only typical aspects of the invention, and therefore should not be considered as limiting the scope of the invention.

Figure 1:
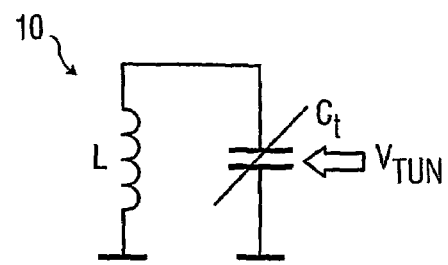
FIG. 1 illustrates a tuned LC band-pass filter with variable capacitance $C_t$ and fixed inductance L.

A tuned LC band-pass filter 10 is illustrated in FIG. 1. The band-pass filter 10 comprises a variable total capacitance $C_t$ and an inductive coil L arranged in parallel. The band-pass filter 10 is tuned by a tuning voltage $V_{TUN}$, which is applied to a varicap diode (not shown) coupled to the band-pass filter 10. When L is fixed, the resonant frequency $\omega_{tank}$ of the band-pass filter 10 is given by:

$$\omega_{tank} = \omega_{LO} \pm \omega_{IF} \qquad \text{(EQU. 1)}$$

or:

$$\omega_{tank}^2 = 1/LC_t, \qquad \text{(EQU. 2)}$$

This implies that:

$$\omega_{tank}^2 C_t = 1/L = \text{constant}, \qquad \text{(EQU. 3)}$$

which leads to:

$$C_t :: \omega_{tank}^{-2} = (\omega_{LO} \pm \omega_{IF})^{-2}, \qquad \text{(EQU. 4)}$$

which is the frequency-dependent relation that is needed for tracking.

In a frequency-synthesized tuner that includes such a band-pass tuner filter 10, the local oscillator frequency $\omega_{LO}$ of the tuner, which is applied at a mixer, relates to a reference X-tal oscillator frequency $\omega_{xtal}$ via:

$$\omega_{LO} = N_{div}/M_{div} \omega_{xtal} \qquad \text{(EQU. 5)}$$

where $M_{div}$ is a fixed-frequency-divider ratio, and $N_{div}$ is a programmable frequency divider. Given a fixed reference X-tal oscillator frequency $\omega_{xtal}$, then EQU. 5 implies that:

$$\omega_{LO} :: N_{div}, \qquad \text{(EQU. 6)}$$

which also implies from EQU. 1 that for zero- or low-IF:

$$\omega_{tank} = (\omega_{LO} \pm \omega_{IF}) :: N_{div} \qquad \text{(EQU. 7)}$$

For a zero-IF tuner concept, the resonance frequency $\omega_{tank}$ of the band-pass filter 10 equals the local oscillator frequency $\omega_{LO}$ of the tuner for proper tracking. For a near-zero IF concept $\omega_{tank} \approx \omega_{LO}$ and consequently, from EQU. 4:

$$C_t :: \omega_{LO}^{-2}. \qquad \text{(EQU. 8)}$$

From EQU. 7, this leads to:

$$C_t :: N_{div}^{-2}. \qquad \text{(EQU. 9)}$$

Figure 2:
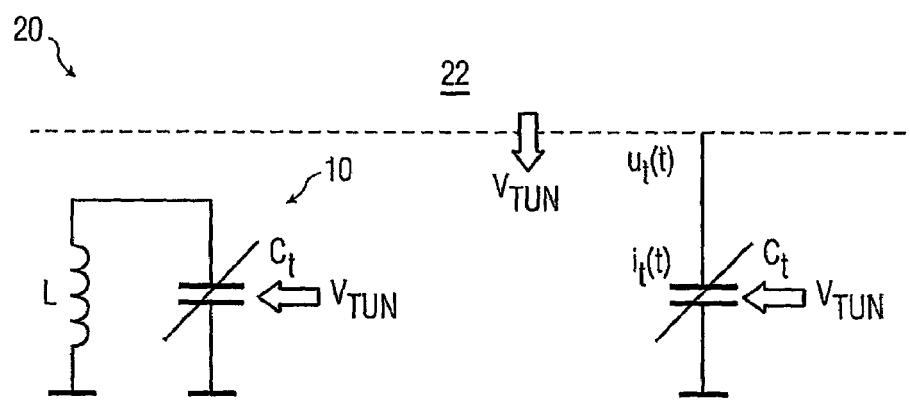
FIG. 2 illustrates a variable external load capacitance $C_t$ and the tuned LC band-pass filter of FIG. 1.

For a low-IF IC-concept (e.g., near-zero or zero-IF), the oscillator or divided oscillator frequency can, for example, be offered via a current source to an external load capacitor $C_t$, which is matched with the capacitance $C_t$ in the band-pass filter 10. An integrated tuner circuit 20 including the band-pass filter 10 and an external load capacitor $C_t$ is illustrated in FIG. 2. The integrated tuner circuit 20 includes an integrated circuit 22 having a control loop (not shown) for producing the tuning voltage $V_{TUN}$. The external load capacitor $C_t$ is tuned by the tuning voltage $V_{TUN}$, which is applied to a varicap diode (not shown) being part of the external load capacitor $C_t$. Defining the voltage across the external capacitor $C_t$ as:

$$u_t(t) = N_{div}^2 U_t \cos \omega_{xtal} t, \qquad \text{(EQU. 10)}$$

it follows that:

$$i_t(t) = -\omega_{xtal} C_t N_{div}^2 U_t \sin \omega_{xtal} t. \qquad \text{(EQU. 11)}$$

By making $i_t(t)$ amplitude independent of $N_{div}$ and $C_t$, then:

$$C_t :: N_{div}^{-2} \qquad \text{(EQU. 12)}$$

Thus, the capacitance the external load capacitor $C_t$ and the capacitor $C_t$ in the band-pass filter 10 are both proportional to $N_{div}^{-2}$. As such, in case of tracking between an oscillator in a zero- or low-IF frequency concept and a varicap-tuned LC band-pass filter 10 with fixed L and variable $C_t$ the integrated tuner circuit 20 can generate a very well defined oscillator-frequency related voltage across the matched load capacitor $C_t$. Conversely, in case of no tracking, the voltage will deviate from the predicted oscillator frequency dependent behavior. If, in that case the integrated tuner circuit 20 would generate a tuning voltage $V_{TUN}$ for the capacitor $C_t$ of the band-pass filter 10 as well as the external load $C_t$, a control loop can be defined such that the (frequency divided) oscillator voltage across $C_t$ behaves as needed for tracking. The control loop will ensure that the frequency-dependent behavior for the oscillator and band-pass filter 10 is the same, which means that band-pass filter 10 and the oscillator will de-tune with the same factor all the time.

In the above-described approach, it is assumed that the external load capacitor $C_t$ is the only external load to the integrated tuner circuit 20. However, the integrated tuner circuit 20 will also add additional capacitive load, which will cause tracking errors especially at the higher end of the frequency band, where $C_t$ becomes small. The added capacitance (i.e., parasitic capacitance $C_p$) is determined by the integrated tuner circuit 20 package as well as by on-chip capacitance. Since the value of $C_p$ can be estimated beforehand during design of the integrated tuner circuit, compensation in the control loop 30 can be taken into account.

The present invention provides a fixed-frequency control loop 30 (FIG. 3) for tuning the capacitance $C_t$ of the band-pass filter 10 such that the band-pass filter 10 keeps tracking with a virtually-variable oscillator frequency (i.e., a frequency that need not be present in the integrated tuner circuit 20), after alignment (if necessary) at one frequency point The control loop 30 is located within the integrated tuner circuit 20, while the band-pass filter 10 and external load capacitance $C_t$ are located outside the integrated tuner circuit 20. The resonance frequency $\omega_{tank}$ of the band-pass filter 10 is approximately equal to $\omega_{LO} \pm \omega_{IF}$.

In view of the above analysis, the control loop 30 has been designed to produce a signal having a relevant component given by the expression:

$$1-(\alpha\omega_{xtal}^2 R^2 C)N^2 C_t. \quad (EQU. 13)$$

where $\alpha$ is a variable gain, $\omega_{xtal}$ is the X-tal oscillator 32 frequency, R is a resistance, C is a capacitance, and N is a programmable value proportional to $N_{div}$ for setting the value of $\omega_{LO}$. $N_{div}$ has been converted into N, because $N_{div}$ is usually a 15 bit number, which enables small oscillator steps, but the band-pass filter 10 steps are allowed to be much larger and consequently N can be limited to, e.g., a seven bit word proportional to $N_{div}$. From EQU. 7, therefore:

$$\omega_{LO} \approx \omega_{tank} \Leftrightarrow N_{div} \approx N. \quad (EQU. 14)$$

Both previous equations ($\omega_{LO} :: N_{div}$ (EQU. 6) and $\omega_{tank} = (\omega_{LO} \pm \omega_{IF}) :: N$ (EQU. 7)) are valid and implicitly an $\omega_{LO}$ and $\omega_{IF}$ dependent relation between N and $N_{div}$ follows. By programming N and $N_{div}$ accordingly, tracking is obtained. In case of zero- or low-IF, $N_{div} \approx N$ will be sufficient for tracking.

In EQU. 13, N and $C_t$ are the only oscillator frequency dependent components. As such, as long as $\omega_{LO} :: N_{div} \approx N$, the capacitance $C_t$ will be tuned such that:

$$1-(\alpha\omega_{xtal}^2 R^2 C)N^2 C_t \rightarrow 0 \quad (EQU. 15)$$

to ensure that the band-pass filter 10 keeps tracking with the desired oscillator frequency.

Figure 3:
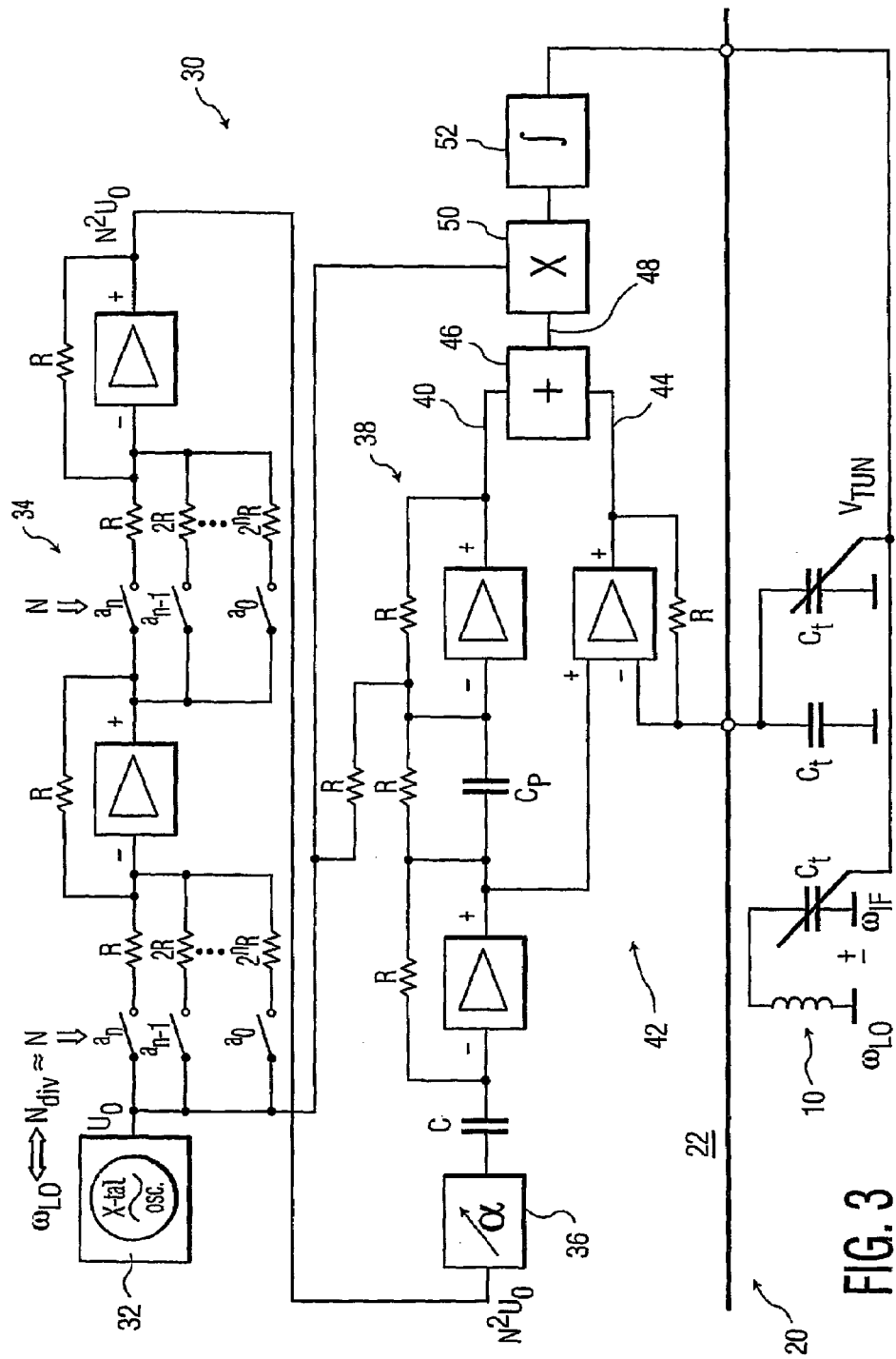
FIG. 3 is a block diagram of an integrated tuner circuit including a fixed-frequency control loop for filter tracking in accordance with the present invention.

In the control loop 30, the output $U_0$ of oscillator 32 is passed through an analog multiplying circuit 34 of a type known in the art to produce a signal $U_0 N^2$. For example, as illustrated in FIG. 3, the analog multiplying circuit 34 may comprise two identical cascaded amplifiers with programmable gain. It should be noted that N and $U_0 N^2$ may also be provided digitally. The value N corresponding to the desired tuning oscillator frequency $\omega_{LO}$ of the band-pass filter 10 is provided to the multiplying circuit 34 via software or hardware control. The signal $U_0 N^2$ is passed through adjustable gain circuit 36 into a stage 38 designed to produce a signal 40 given by:

$$-U_0\{1-\alpha N^2(j\omega_0 RC - \omega_{xtal}^2 R^2 CC_p)\}. \quad (EQU. 16)$$

A feedback stage 42 is provided to produce a signal 44 given by:

$$-\alpha N^2 U_0\{j\omega_{xtal} RC - \omega_{xtal}^2 R^2 C(C_t + C_p)\} \quad (EQU. 17)$$

In the block diagram, it is assumed that compensation for the parasitic capacitance $C_p$ of the integrated circuit 20 has been provided during the integrated circuit design phase and, as such, $C_p$ appears in stage 38 and in parallel to the external load capacitance $C_t$.

The circuit analysis for deriving the expressions presented in EQUS. 16 and 17 from stages 38 and 40, respectively, is assumed to be within the scope of those skilled in the art and will not be presented in detail herein. Also, it should be appreciated that the expressions presented in EQUS. 16 and 17 may be provided using analog and/or digital circuitry other than that disclosed herein and illustrated in FIG. 3.

The signals 40, 44 presented in EQUS. 16 and 17, respectively, are combined in an adder 46, resulting in a signal 48 given by:

$$-U_0\{1-(\alpha\omega_{xtal}^2 R^2 C)N^2 C_t\}. \quad (EQU. 18)$$

After mixing 50 the signal 38 with the oscillator 32 signal, and integrating 52 to a 30 tuning voltage $V_{TUN}$, $C_t$ is controlled such that the expression presented in EQU. 13, namely, $1-(\alpha\omega_{xtal}^2 R^2 C)N^2 C_t \rightarrow 0$, is realized. Consequently, $C_t :: (\omega_{LO} \pm \omega_{IF})^{-2}$, or $C_t :: \omega_{LO}^{-2}$ for zero- and low-IF, which are the frequency dependent relations needed for tracking.

In the present invention, the fixed-frequency control loop 30 uses the value N, which is approximately equal to the frequency division ratio $N_{div}$, for oscillator tuning without using the actual oscillator frequency $\omega_{LO}$ itself. In the high-IF case where the ratio N, used for tuning the band-pass filter IO tracking, does not correspond with $N_{div}$ (i.e., $N_{div} \neq N$), the band-pass filter 10 may be tuned to a frequency different from the than the desired oscillator frequency $\omega_{LO}$. In this case, separate programming is required for $N_{div}$ and N. However, after a single alignment, the frequency to which the band-pass filter 10 is tuned is accurately known for each value of N. The alignment may be accomplished via the variable gain $\alpha$ provided by the adjustable gain circuit 36, and/or by adjusting the fixed value of the inductor L in the band-pass filter 10. Alternately, or in addition, for a small frequency offset between the band-pass filter 10 and the oscillator frequency $\omega_{LO}$, some mismatch can be given to the external load capacitance $C_t$ relative to the capacitance $C_t$ in the band-pass filter 10. Consequently, by independently addressing the values for N, the band-pass filter 10 can be tuned to each wanted IF distance from the desired oscillator frequency $\omega_{LO}$. It should be noted that for non-zero concepts, a frequency offset may also be realized by adaptation of the voltage dependency of the external load capacitance $C_t$.

As stated above, the invention is not limited to zero- or low-IF applications. After the single frequency alignment by, e.g., adjusting the gain value $\alpha$, with programmable N and $\omega_{xtal}$, the tuned LC band-pass filter 10 is tuned to each wanted frequency. Along this way, the band-pass filter 10 becomes a "frequency synthesized" filter, which is locked to "virtual oscillator frequency" $N\omega_{xtal}$, since this frequency need not be present in the IC.

The freedom to choose the value for N allows the present invention to provide a single integrated tuner circuit with arbitrary IF output. Supradyne, infradyne, zero-IF, up-conversion or one-oscillator applications can all be realized with tracking using the present invention. These applications may be provided "all-in-one" under software control using the same integrated tuner circuit.

Several other features provided by the present invention should also be noted. For example, the parasitic capacitance $C_p$, caused by the integrated circuit 20 itself, can be overcompensated inside the integrated circuit 20. As such, for proper tracking, a capacitor $C_p$, needs to be externally connected to the integrated circuit. Advantageously, the LC band-pass filter 10 can always be designed for minimum unwanted parallel capacitance and consequently maximum frequency range. Further, the fixed-frequency control loop 30 may use the X-tal oscillator frequency $\omega_{xtal}$ in the loop. This minimizes the risk of interference, since no new frequencies are introduced.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. An integrated tuner circuit, comprising:
   a tuned LC band-pass filter having a variable capacitance ($C_t$) and fixed inductance (L);
   an external load capacitor having a variable capacitance ($C_t$); and
   a fixed-frequency control loop for producing a voltage ($V_{TUN}$) for adjusting the variable capacitances of the band-pass filter and external load capacitor to achieve tracking of the band-pass filter with an arbitrary oscillator frequency $\omega_{LO}$.

2. The integrated tuner circuit according to claim 1, wherein the fixed-frequency control loop further comprises a fixed-frequency oscillator and a circuit for receiving a programmable value N for setting the value of $\omega_{LO}$, wherein the fixed-frequency control loop adjusts the variable capacitances $C_t$ such that $C_t :: (\omega_{LO} \pm \omega_{IF})^{-2} :: N^{-2}$, wherein $\omega_{IF}$ is an intermediate frequency.

3. The integrated tuner circuit according to claim 2, wherein the band-pass filter is tuned to each of a plurality of different IF distances from $\omega_{LO}$ by adjusting the programmable value N.

4. The integrated tuner circuit according to claim 2, wherein the fixed-frequency oscillator outputs a signal having a frequency $\omega_{xtal}$, and wherein the tuned LC band-pass filter is tuned to a virtual oscillator frequency $\omega_{LO}$ given by $N\omega_{xtal}$.

5. The integrated tuner circuit according to claim 1, wherein the fixed-frequency control loop provides compensation for parasitic capacitance ($C_p$).

6. The integrated tuner circuit according to claim 5, further comprising a capacitor corresponding to the parasitic capacitance $C_p$ in parallel with the external load capacitor.

7. The integrated tuner circuit according to claim 1, wherein the fixed-frequency control loop operates to produce a signal:

$$1-(\alpha\omega_{xtal}^2 R^2 C)N^2 C_t \to 0$$

where $\alpha$ is a variable gain, $\omega_{xtal}$ is a frequency of a fixed-frequency oscillator, R is a resistance, C is a capacitance, and N is a programmable value for setting the value of $\omega_{LO}$.

8. The integrated tuner circuit according to claim 7, wherein N and $C_t$ are the only oscillator frequency dependent variables.

9. A method for tracking a LC tuned band-pass filter with an arbitrary oscillator $\omega LO$, wherein the band-pass filter includes a variable capacitance $C_t$ and a fixed inductance (L), comprising:
   providing a fixed-frequency control loop for producing a voltage ($V_{TUN}$) for adjusting the variable capacitance $C_t$ of the tuned band-pass filter and for adjusting a variable capacitance $C_t$ of a load capacitor; and
   inputting a programmable value N into the fixed-frequency control loop for setting the value of $\omega_{LO}$, wherein the fixed-frequency control loop adjusts the variable capacitances $C_t$ such that $C_t :: (\omega_{LO} \pm \omega_{IF})^{-2} :: N^{-2}$, wherein $\omega_{IF}$ is an intermediate frequency.

10. The method according to claim 9, further comprising:
    tuning the band-pass filter to each of a plurality of different IF distances from $\omega_{LO}$ by adjusting the programmable value N.

11. The method according to claim 9, wherein the fixed-frequency control loop includes a fixed-frequency oscillator that outputs a signal having a frequency $\omega_{xtal}$, further comprising:
    tuning the band-pass filter to a virtual oscillator frequency $\omega_{LO}$ given by $N\omega_{xtal}$.

12. The method according to claim 9, wherein the fixed-frequency control loop provides compensation for parasitic capacitance ($C_p$).

13. The method according to claim 12, further comprising:
    providing a capacitor corresponding to the parasitic capacitance $C_p$ in parallel with the load capacitor.

14. The method according to claim 9, wherein the fixed-frequency control loop operates to produce a signal:

$$1-(\alpha\omega_{xtal}^2 R^2 C)N^2 C_t \to 0$$

where $\alpha$ is a variable gain, $\omega_{xtal}$ is a frequency of a fixed-frequency oscillator, R is a resistance, and C is a capacitance.

15. The method according to claim 14, wherein N and $C_t$ are the only oscillator frequency dependent variables.

* * * * *